United States Patent [19]

Wilcox

[11] Patent Number: 5,047,623

[45] Date of Patent: Sep. 10, 1991

[54] TRANSPARENT SELECTIVE ILLUMINATION MEANS SUITABLE FOR USE IN OPTICALLY ACTIVATED ELECTRICAL SWITCHES AND OPTICALLY ACTIVATED ELECTRICAL SWITCHES CONSTRUCTED USING SAME

[75] Inventor: Russell B. Wilcox, Oakland, Calif.

[73] Assignee: The United States of America as represented by the United States Department of Energy, Washington, D.C.

[21] Appl. No.: 473,793

[22] Filed: Feb. 2, 1990

[51] Int. Cl.$^5$ .............................................. H01J 40/14
[52] U.S. Cl. .......................... 250/211 R; 250/2.11 J; 250/227.32; 250/551; 357/30
[58] Field of Search ................ 250/211 R, 551, 211 J, 250/227.32; 307/311; 357/30 R, 30 L

[56] References Cited

U.S. PATENT DOCUMENTS

| | | | |
|---|---|---|---|
| 3,952,265 | 4/1976 | Hunsperger | 250/551 |
| 4,240,088 | 12/1980 | Myers | 250/551 |
| 4,358,676 | 11/1982 | Childs et al. | 250/211 J |
| 4,533,833 | 8/1985 | Copeland et al. | 250/551 |
| 4,691,111 | 9/1987 | Bovino | 250/551 |
| 4,695,120 | 9/1987 | Holder | 350/96.11 |
| 4,695,733 | 9/1987 | Pseavento | 250/551 |
| 4,711,997 | 12/1987 | Miller | 250/216 |

Primary Examiner—David C. Nelms
Assistant Examiner—Que T. Le
Attorney, Agent, or Firm—L. E. Carnahan; Roger S. Gaither; William R. Moser

[57] ABSTRACT

A planar transparent light conducting means and an improved optically activated electrical switch made using the novel light conducting means are disclosed. The light conducting means further comprise light scattering means on one or more opposite planar surfaces thereof to transmit light from the light conducting means into adjacent media and reflective means on other surfaces of the light conducting means not containing the light scattering means. The optically activated electrical switch comprises at least two stacked photoconductive wafers, each having electrodes formed on both surfaces thereof, and separated by the planar transparent light conducting means. The light scattering means on the light conducting means face surfaces of the wafers not covered by the electrodes to transmit light from the light conducting means into the photoconductive wafers to uniformly illuminate and activate the switch.

37 Claims, 4 Drawing Sheets 5,047,623

TRANSPARENT SELECTIVE ILLUMINATION MEANS SUITABLE FOR USE IN OPTICALLY ACTIVATED ELECTRICAL SWITCHES AND OPTICALLY ACTIVATED ELECTRICAL SWITCHES CONSTRUCTED USING SAME

BACKGROUND OF THE INVENTION

The Government has rights in this invention pursuant to Contract No. W-7405-ENG-48 between the U.S. Department of Energy and the University of California.

This invention relates to transparent selective illumination means and optically activated electrical switches constructed using same. More particularly, this invention relates to transparent selective illumination means to internally illuminate stacks of photoconductive wafers formed with switch electrodes thereon comprising such optically activated switches.

Optically activated electrical switches comprise at least two electrodes spaced apart on a photoconductive material which is made conductive by illumination of the photoconductive material in the space formed between the two electrodes. For example, in Pesavento U.S. Pat. No. 4,6595,733 a photoconductive switch is disclosed which comprises a pair of electrodes formed spaced apart from one another on one surface of a group III-V semiconductor such as indium phosphide. Light from a diode laser illuminates the gap in the semiconductor between the electrodes to open and close the switch. The length of the sides of the electrodes facing one another determines the operating current through the switch while the width of the gap between the electrodes is determined by the desired operating voltage.

It is also known to form the electrodes on both surfaces of the photoconductor so that the gap between the electrodes is not across the surface of the photoconductor but rather across the thickness of the photoconductor wafer. This avoids surface breakdown which is a problem when large electric fields are present. The bulk breakdown field is much higher than the surface breakdown field. If electrodes are placed on opposite sides of a photoconductive wafer, with the linear distance along the surface between them sufficiently large (this being provided by an unmetallized border around the electrode to the edge of the wafer) breakdown will have to occur in the bulk rather than on the surface. This configuration is, therefore, advantageous for use in high voltage switches.

Bovino U.S. Pat. No. 4,691,111 shows optically activated switches in which the thickness of a photoconductive substrate is used to form gaps between the electrodes of the switch. An electrode formed on a first surface of the photoconductor substrate is coupled through the gap to a second electrode formed on the opposite surface of the substrate. The second electrode is, in turn, then coupled back through the semiconductor to a third electrode on the first surface. This sequence can be repeated through a series of electrodes formed alternately on opposite surfaces of the photoconductive substrate to increase the hold-off voltage of the switch.

In the structures depicted in the Bovino patent, the current path crosses the gap between the opposite surfaces of the photoconductor at least twice, thus increasing the hold-off voltage of the switch by increasing the distance or path through the photoconductive material. If a photoconductive wafer was formed with a number of such electrodes in series across the thickness of the photoconductor, as in the Bovine patent, and the wafer was electrically wired in series with one or more similarly formed wafers and such wafers formed into a stack, a compact optically activated switch device could be formed wherein the hold-off voltage could be greatly increased and the switch could be used in very high voltage applications. Alternatively, if a plurality of such wafers were to be wired in parallel and formed into such a stack, the result would be a a compact optically activated switch having greatly increased current-carrying capabilities.

However, since operation of an optically activated switch depends upon illumination of the photoconductive material in the gap formed between electrodes on the photoconductor, it is essential to the operation of the device that all such gaps be illuminated and that they be illuminated fairly uniformly. If a series or stack of such photoconductive wafers are formed, some of the gaps between electrodes in the interior portions of the stack cannot be properly illuminated by conventional illumination means. Failure to properly illuminate all of the gaps in a series device can mean that all of the voltage will appear across the gap or gaps not illuminated which could result in breakdown of the device. Alternatively, for parallel hookups, the total current-carrying capabilities of the switch could be impaired since only the exterior wafers would have all of the gaps illuminated and therefore would be the only portions of the switch carrying current.

It would, therefore, be desirable to provide illumination means which would conduct light into internal portions of an optically activated electrical switch formed from a stack of photoconductive wafers wherein all of the wafers would be illuminated regardless of the position of the wafer in the stack.

SUMMARY OF THE INVENTION

It is, therefore, an object of this invention to provide transparent selective illumination means comprising planar transparent light conducting means including light scattering means on selected portions of both surfaces thereof and suitable for use in an optically activated electrical switch comprising at least two stacked photoconductive wafers.

It is another object of this invention to provide an optically activated electrical switch comprising at least two stacked photoconductive wafers, each having electrodes formed on both surfaces thereof, and separated by planar transparent light conducting means including light scattering means on selected portions of both surfaces thereof to conduct light to the surfaces of the wafers facing the light conducting means.

It is yet another object of this invention to provide an optically activated electrical switch comprising at least two stacked photoconductive wafers, each having electrodes formed on both surfaces thereof, and separated by planar transparent light conducting means comprising a planar glass member capable of conducting light to the surfaces of the wafers facing the light conducting means and containing light scattering means on the surfaces of the glass member opposite surfaces of the wafers not covered by the electrodes to transmit light from the planar glass member into the photoconductive materials of the wafers.

It is still another object of this invention to provide an optically activated electrical switch comprising at least two stacked photoconductive wafers, each having electrodes formed on both surfaces thereof, and separated by transparent planar light conducting means comprising a planar glass member capable of conducting light to the surfaces of the wafers facing the light conducting means and containing light scattering means on the surfaces of the glass member opposite surfaces of the wafers not covered by the electrodes to transmit light from the planar glass member into the photoconductive materials of the wafers, and further containing reflective means on other portions of the surfaces of the planar glass member not containing the light scattering means.

These and other objects of the invention will become apparent from the following description and accompanying drawings.

DETAILED DESCRIPTION OF THE INVENTION

Figure 1:
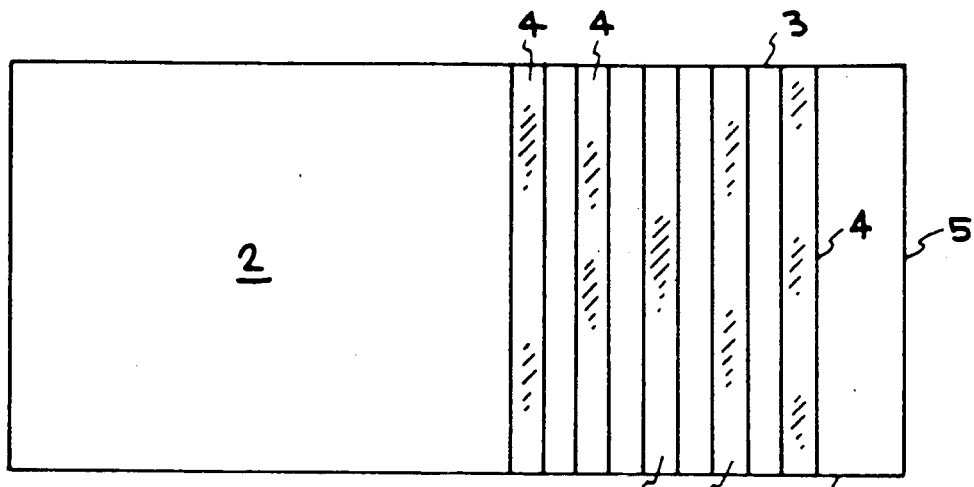
FIG. 1 is a top view of the transparent planar light conducting means of the invention showing the light scattering means formed on the planar surface.
Figure 2:
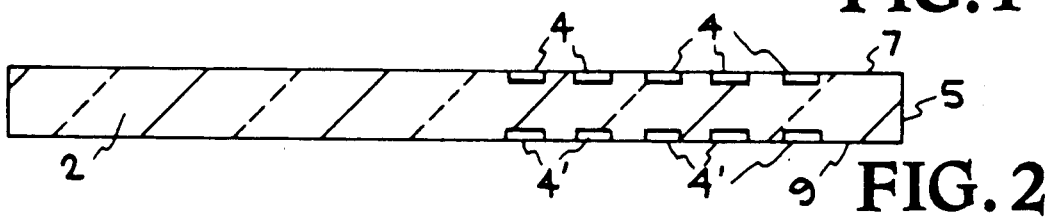
FIG. 2 is a side section view of the transparent planar light conducting means shown in FIG. 1.
Figure 3:
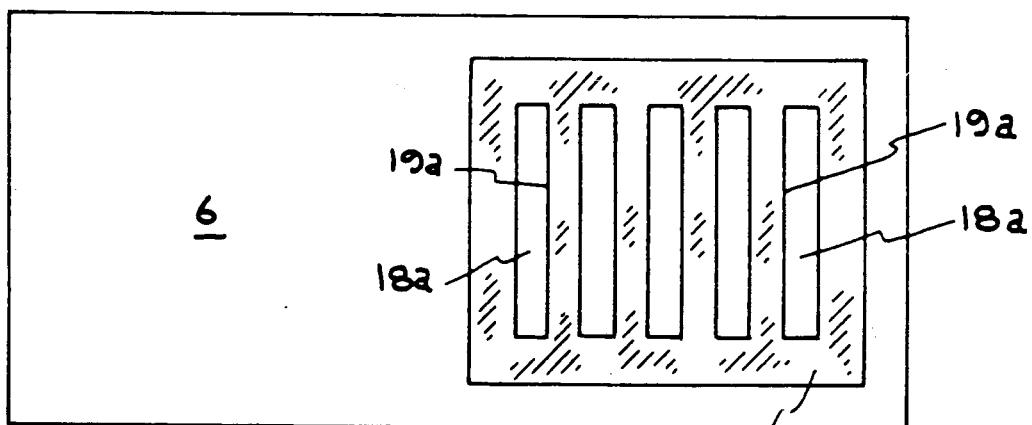
FIG. 3 is a top view of a photoconductive material showing a metal electrode pattern formed on a first surface thereof.
Figure 4:
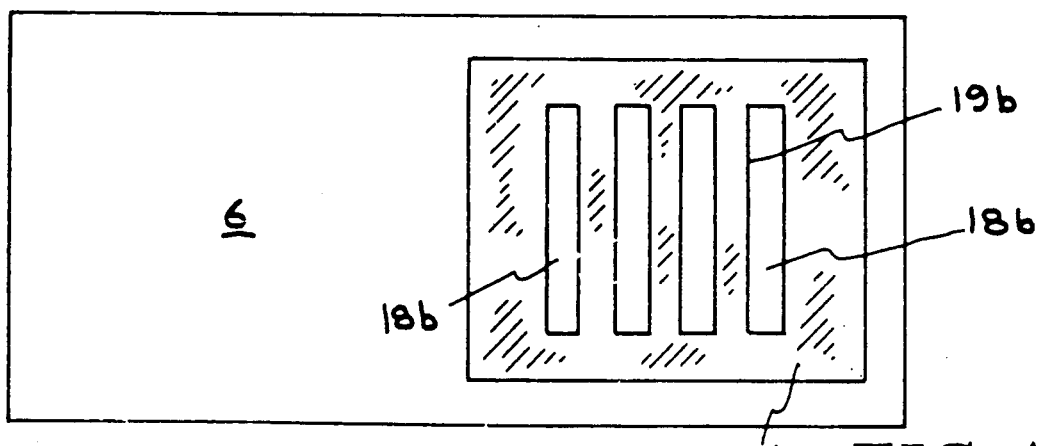
FIG. 4 is a plan view of the opposite surface of the photoconductive material of FIG. 3 showing a second metal electrode pattern formed on this surface which is staggered from the electrode pattern formed on the first surface.
Figure 5:
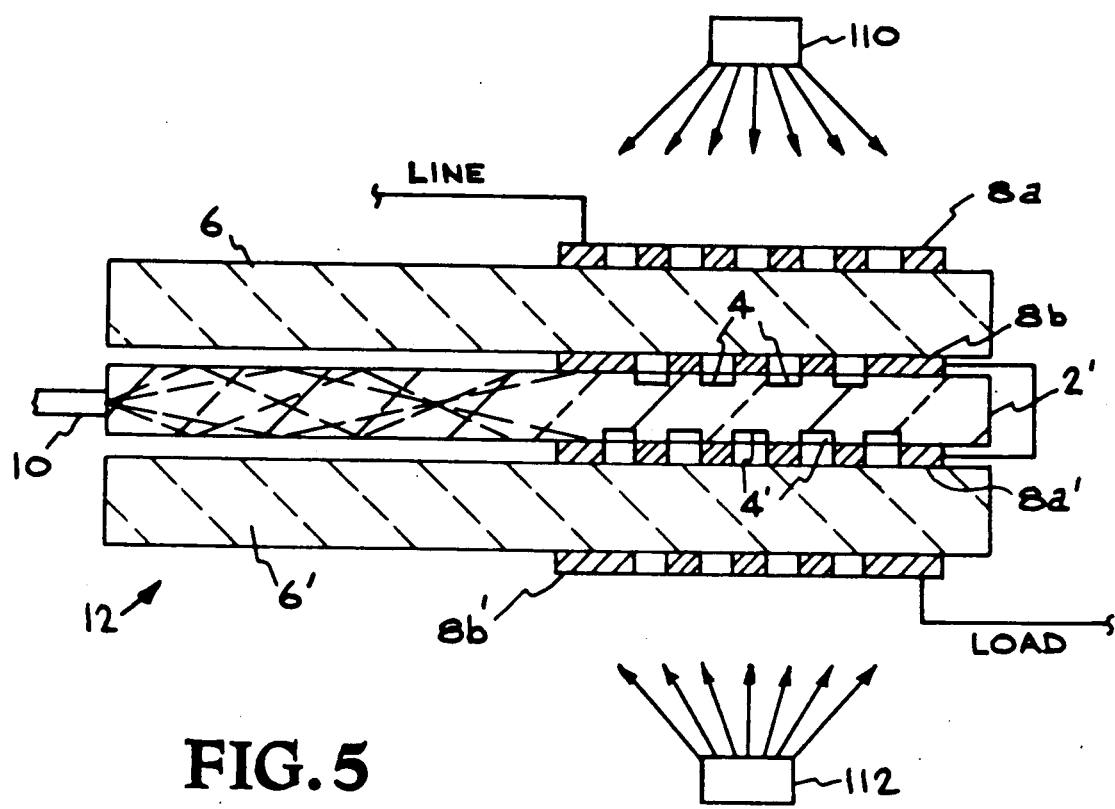
FIG. 5 is a vertical cross-sectional view of an optically activated electrical switch constructed in accordance with the invention using the transparent planar light conducting means of the invention placed in between two photoconductive wafers containing metal electrode patterns on their surfaces as shown in FIG. 3.

Turning now to FIGS. 1-5, planar transparent light conducting means 2 of the invention is shown in FIGS. 1 and 2 with light scattering means 4 and 4' formed in and on the respective surfaces; a photoconductive member 6 having a first metal electrode pattern 8a formed on one surface is shown in FIG. 3; and photoconductive member 6 is shown having a second metal electrode pattern 8b formed on the opposite surface in FIG. 4. An optically activated electrical switch 12 is shown in FIG. 5 formed from planar transparent light conducting means 2 of FIGS. 1 and 2 and a pair of photoconductive members 6 and 6' such as shown in FIGS. 3 and 4 with metal electrode patterns 8a, 8b, and 8a' and 8b' respectively formed on both surfaces of the photoconductive members.

Wafers 6 and 6' may comprise, a photoconductive insulator or a photoconductive semiconductor such as, for example, single crystal silicon or any other photoconductive silicon. Wafers 6 and 6' may also comprise compounds formed from Group III-Group V elements, such as gallium arsenide, or indium phosphide.

The thickness of wafers 6 and 6' may range from a few microns (for example, when photoconductor is a film deposited on a transparent substrate, possibly the transparent illumination means itself) to several centimeters. The thickness depends upon the light absorption depth, which depends upon light wavelength, photoconductor bandgap energy, impurities, and other photoconductor material parameters. These factors can be manipulated to produce an optimum design. Even thicker wafers can, however, be used, but may require additional cooling, or tuning of the light wavelength, to efficiently absorb the light uniformly throughout the bulk of the wafer.

Electrode patterns 8a, 8b and 8a', 8b', respectively formed on the opposite surfaces of wafers 6 and 6' may comprise any metal compatible with the material comprising wafers 6 and 6'. Examples of suitable metals include aluminum and gold.

Electrode pattern 8a, shown in FIG. 3 as formed on the upper surface of photoconductive member 6, may be repeated on the lower surface of photoconductive member 6 or, as shown in FIG. 4, an electrode pattern 8b may be formed on the lower surface with the electrode pattern staggered from the electrode pattern 8a so that spaces 18a in upper electrode pattern 8a are above the electrode bars 19b in electrode pattern 8b and spaces 18b in electrode pattern 8b are below electrode bars 19a in pattern 8a.

As shown in FIG. 5, metal electrode pattern 8a may be connected to a power source (not shown); electrodes 8b and 8a' may connected to one another; and electrode pattern 8b' may be connected to a load so that illumination of optically activated switch 12 causes conduction from electrode 8a through photoconductive wafer 6 to electrode 8b and then from electrode 8a' through wafer 6' to electrode 8b'.

If it is desired to increase the hold-off voltage of the switch, additional wafers can be added to the stack and the electrodes thereon wired in series and, in accordance with the invention, with a planar transparent light conducting means 2 placed between each of the adjacent wafers in the stack. Alternatively, if it is desired to increase the current-carrying capability of the switch, the cross-sectional area of the electrodes on each wafer may be increased (as well as increasing the cross-section size of the wafer, if necessary to accommodate a larger electrode pattern). Alternatively, the electrode patterns on two or more wafers could be connected together in parallel to increase the current-carrying capabilities of the switch.

However, in any case, to ensure proper electrical conduction through wafers 6 and 6' (and any additional wafers which may be present in the stack), it is important that all regions in wafers 6 and 6' which are expected to conduct upon activation of switch 12 are sufficiently illuminated. In accordance with the invention, the provision of planar transparent light conducting means 2 between wafers 6 and 6' provides this desired illumination and resultant uniform photoconduction through wafers 6 and 6'.

Figure 10:
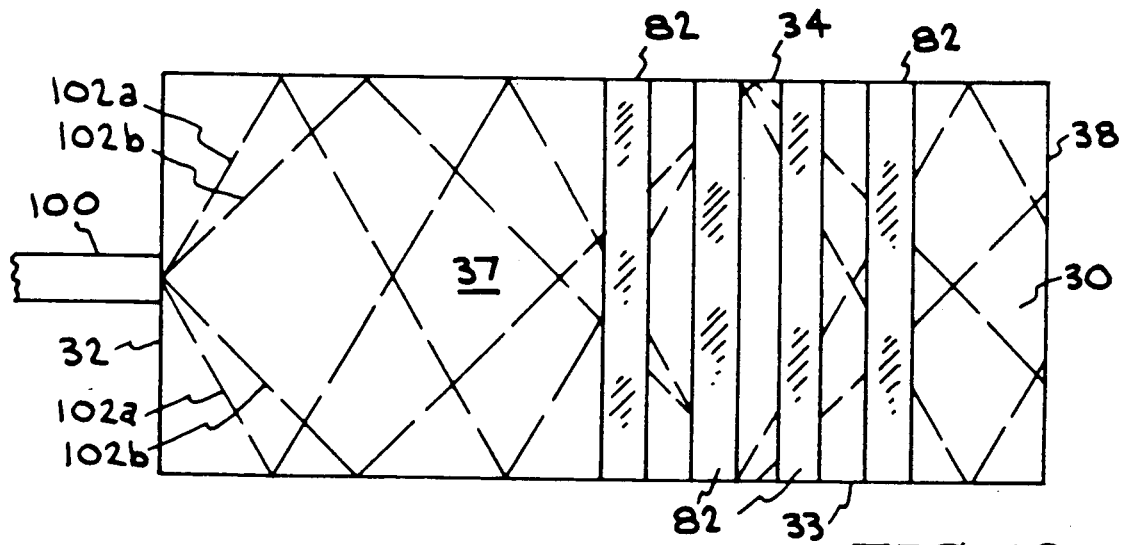
FIG. 10 is a bottom view of the light conducting means of FIG. 9 showing the light scattering areas formed on the bottom surface of the light conducting means.
Figure 11:
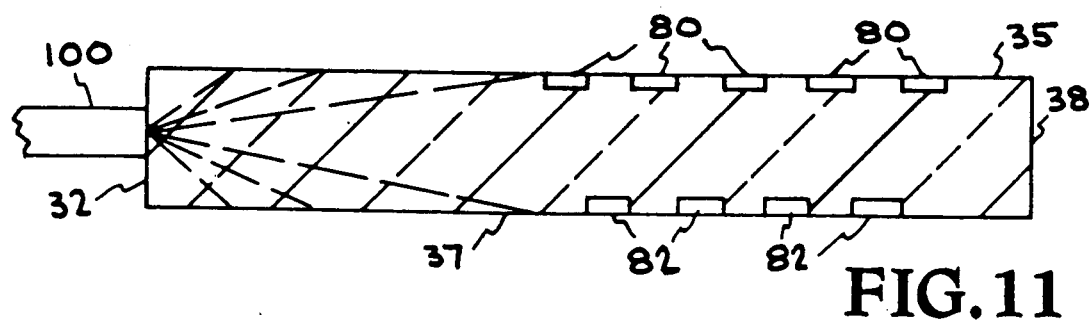
FIG. 11 is a vertical cross-sectional view of the light conducting means of FIGS. 9 and 10 showing the reflection of the light beams traveling down the length of the light conducting means.
Figure 9:
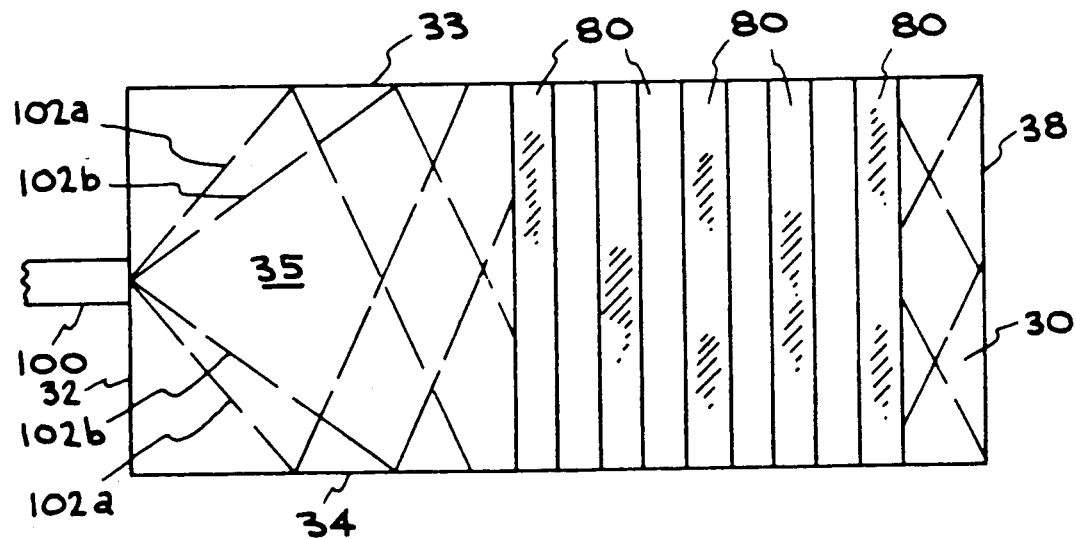
FIG. 9 is a top view of one of the transparent planar light conducting means shown in FIG. 6 showing the light scattering areas formed on the top surface of the light conducting means.

As shown in FIG. 5, as well as in FIGS. 9-11, light enters planar transparent light conducting means 2 at one end and then is transmitted or conducted along light conducting means 2 by reflecting off the sidewalls of the light conducting means. Thus light enters light conducting means 2 of FIGS. 1 and 2 from a light source 10, while light enters light conducting means 30 of FIGS. 9-11 from light source 100. Light sources 10 and/or 100 may comprise a fiber optic, as illustrated, or some other light source, but must be capable of transmitting divergent light into light conducting means 2, 30, and/or 50 as shown by the exemplary light paths 102a-102b shown in dotted lines in FIGS. 9 and 10 and and the dotted line paths shown in FIG. 5 and 11.

Planar transparent light conducting means 2 of FIGS. 1 and 2 may comprise any transparent material, such as a transparent crystalline material, a transparent fused quartz, a transparent plastic, or a transparent glass material, having a higher index of refraction than the surrounding media, typically air. If a cooling media, such as Freon, is used, then transparent light conducting means 2 will have a higher refractive index than the Freon, to permit total internal reflection, except in those regions where light scattering means 4 and 4' have been formed, as will be described below.

By "total internal reflection" is meant that the light intersects the side surfaces of the light conducting means at an angle greater than the critical angle (the angle formed between the perpendicular and the light path below which light will not be reflected). However, since the ultimate goal is uniform illumination along the length of the transparent light conducting means, and since this is achieved by multiple reflection of the light off the side surfaces, the differences in the respective indices of refraction must be sufficient to provide a small enough critical angle to result in multiple reflections of the light as it passes down the transparent light conducting means While the transmission of light from light sources 10 and 100 through the light conducting means to the interior of surface areas of the photoconductive wafers will now be described, it will be understood that light source 10 or 100 may be used in combination with light sources 110 and 112 which may simultaneously be used to illuminate the exterior surfaces of the wafers in the switch stack while light source 10 or 100 is used to illuminate the interior surfaces of the wafers.

Turning in particular to FIGS. 1-2, the construction of transparent light conducting means 2 will be described. Side surfaces 1 and 3 of light conducting means 2 are both polished to reflect the divergent beams of light back to the interior of light conducting means 2 while end surface 5 may be provided with a mirrored surface to reflect the light back across light conducting means 2.

Top surface 7 of planar light conducting means 2 is also polished but has non-polished light scattering surface areas 4 formed therein which are in registry with the areas 18 on the surface of photoconductive wafer 6 not covered by electrode pattern 8a. Bottom surface 9 may optionally also be provided with light scattering areas 4', if desired, as shown in FIGS. 2 and 5. In FIG. 2, light scattering areas 4' on bottom surface 9 are shown formed directly below light scattering areas 4 on upper surface 7, while FIG. 5 shows light scattering areas 4' shown formed in staggered relationship to upper light scattering areas 4. Which arrangement will be used (if both surfaces are formed with light scattering areas) will depend upon the electrode configuration formed on the surface of photoconductive member 6 since the purpose of the light scattering areas is to pass light into the photoconductive member in areas not covered by the electrode pattern.

It should further be noted, in this regard, that if light scattering areas 4 are only provided on one surface of light conducting means 2, the electrode pattern on the surfaces of the wafers facing both sides of light conducting means 2 should preferably be the same, with the open spaces in the electrode patterns in registry with the light scattering areas to maximize lighting of the interior of the photoconductive wafers.

Light scattering surfaces 4 (and 4' when present) do not reflect light back into light conducting means 2 but instead illuminate the abutting regions of wafer 6 beneath openings 18a in electrode pattern 8a. Since these regions comprise the photoconductive gaps between electrode pattern 8a on the top surface 7 of wafer 6, and between electrode patterns 8a' on wafer 6', as shown in FIG. 5, their illumination through light scattering surfaces 4 and 4' cause conduction of electrical current across the thicknesses of wafers 6 and 6' thus placing switch 12 in a conductive or on mode.

Conversely, extinguishment of light source 10 (and sources 110 and 112) results in non-illumination of the regions in photoconductive wafers 6 and 6' by light scattering surfaces 4 and 4', placing switch 12 in a nonconductive or off mode (or in a mode wherein the photoconductor begins to lose its conductivity, depending upon the type of photoconductive material used).

As discussed above, opposite surface 9 of light conducting means 2 may be optionally similarly formed with light scattering areas 4' (FIG. 2) in registry with the spaces 18a' on the top surface of wafer 6' not covered by electrode pattern 8a' so that the portions of wafer 6' representing the gaps between electrode patterns 8a' will also be illuminated by light conducting means 2.

Light scattering surfaces 4 and 4' may be chemically formed on surfaces 7 and 9 by respectively masking surfaces 7 and 9 and then selectively etching the exposed portions of surfaces 7 and 9 with an etchant such as hydrofluoric acid. Alternatively, roughened light scattering surfaces 4 and 4' may be mechanically formed by physical roughening of the surface, e.g., by sand blasting, or transparent light conducting means 2 may be initially formed or molded with roughened light scattering portions 4 and 4'.

FIGS. 6-11 illustrate an alternate embodiment of the invention in which an optically activated electrical switch 16 with somewhat different electrode patterns formed on the photoconductive wafers 20, 40, and 60, resulting in a slightly different placement of the light scattering means in planar light conducting means 30 and 50 placed respectively in between wafers 20, 40, and 60 to provide light scattering regions on opposite surfaces, respectively, of light conducting means 30 and 50 which are staggered with respect to one another, but which are in registry with portions of the wafer surfaces which do not contain metal electrodes thereon as will be described.

Figure 6:
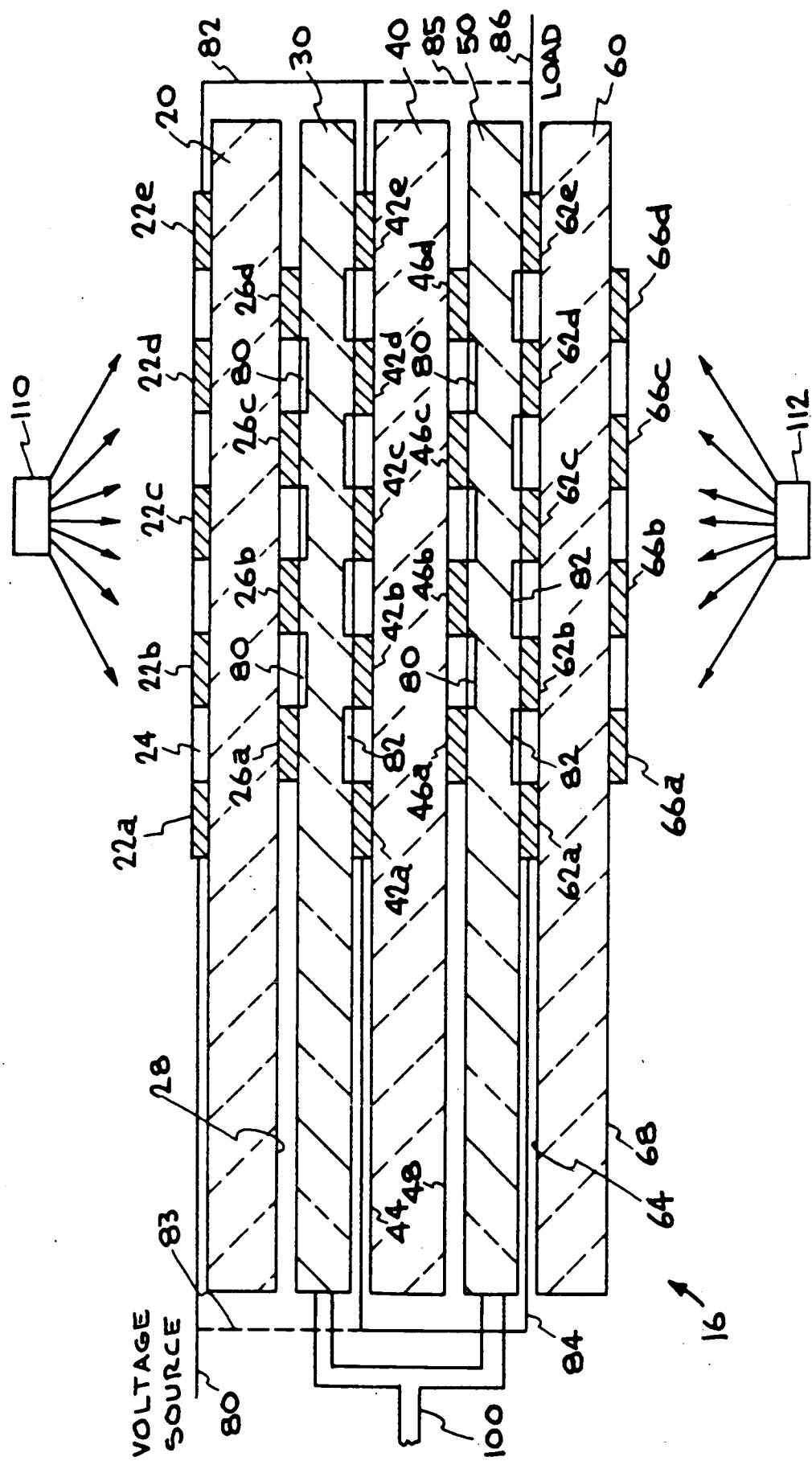
FIG. 6 is a vertical cross-sectional view of another embodiment of an optically activated electrical switch constructed in accordance with the invention comprising a stack of three photoconductive wafers separated from one another by the transparent planar light conducting means of the invention.
Figure 7:
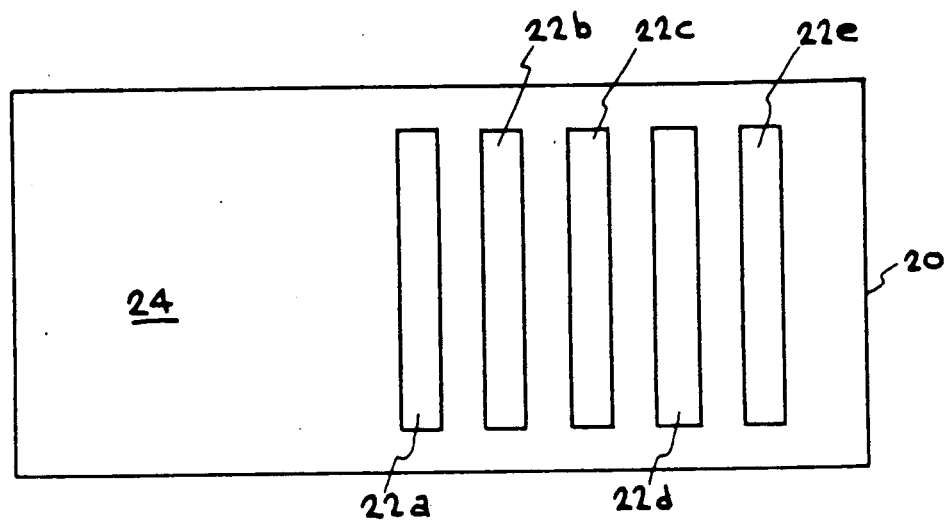
FIG. 7 is a top view of the uppermost photoconductive wafer shown in FIG. 6.

Turning now to FIG. 6, an optically activated electrical switch 16 is shown which generally comprises a first photoconductive wafer 20, a planar glass light conducting member 30, a second photoconductive wafer 40, a second planar glass member 50, and a third photoconductive wafer 60.

Wafer 20 is provided with a first set of parallel spaced apart rectangular electrodes 22a-22e formed on a first surface 24 and a second set of spaced apart rectangular electrodes 26a-26d formed on opposite surface 28 of wafer 20 and offset from the first set of electrodes.

Wafers 40 and 60 are similarly constructed to wafer 20 with electrodes 42i a-42e formed on surface 44 of wafer 40 and electrodes 46a-46d formed on surface 48 of wafer 40 while wafer 60 has electrodes 62a-62e formed on surface 464 and electrodes 66a-66d formed on surface 68 of wafer 60.

Wafers 20, 40, and 60 may comprise any of the photoconductive materials previously described with respect to wafer 6 and 6'. As in the previous embodiment, the thickness of wafers 20, 40, and 60 may range from a few microns to several millimeters or thicker.

As described with respect to electrode patterns 8a and 8b, electrodes 22a-22e and 26a-26d formed on wafer 20, and the corresponding electrodes formed on wafers 40 and 60, may comprise any metal compatible with the material comprising wafers 20, 40, and 60. The thickness of the electrodes must be sufficient to carry the amount of current which will flow through switch 16. Usually the thickness of the electrodes formed on wafers 20, 40, and 60 will range from about 5 to about 100 microns.

The width of each electrode may vary with photoconductor thickness. For example, for a photoconductor thickness of about 1 millimeter, the width of the electrode may typically vary from a minimum of about 0.1 mm to a maximum of about 2 mm. While wider electrodes could be used to increase the current-carrying capabilities, this can have the practical effect of limiting the number of electrodes to be placed in parallel on one surface of the electrode which, in turn, will affect the maximum hold-off voltage. Therefore, to increase the current-carrying capability, it is preferred to increase the length of each electrode, rather than its width. Also, excessive electrode width will mask or obscure more area of the photoconductor from light.

Turning in particular to FIGS. 9-11, the construction of transparent light conducting means 30 will be described. Since, however, transparent light conducting means 30 is identical to transparent light conducting means 50 shown in FIG. 6, the following description will, in general, be equally applicable to light conducting means 50.

Similarly to the previously described light conducting means 2, side surfaces 33 and 34 of light conducting means 30 are both polished to reflect the divergent beams of light back to the interior of light conducting means 30 while end surface 38 may be provided with a mirrored surface to reflect the light back across light conducting means 30.

Top surface 35 of planar light conducting means 30 is also polished but has non-polished light scattering surface areas 80 formed therein which are in registry with the areas of bottom surface 28 on wafer 20 not covered by electrodes 26a-26d.

Light scattering surfaces 80 do not reflect light back into light conducting means 30 but instead illuminate the abutting regions of wafer 20. Since these regions comprise the photoconductive gaps between electrodes 22a-22e and 26a-26d, their illumination through light scattering surfaces 80 cause conduction of electrical current across the gaps thus placing switch 16 in a conductive or on mode. Conversely, extinguishment of light source 100 results in non-illumination of the regions in photoconductive wafer 20 by light scattering surfaces 80, placing switch 16 in a non-conductive or off mode (or in a mode wherein the photoconductor begins to lose its conductivity, depending upon the type of photoconductive material used).

Opposite surface 37 of light conducting means 30 is similarly formed with light scattering areas 82 in registry with the areas on top surface 44 of wafer 40 not covered by electrodes 42a-42e so that the portions of wafer 40 representing the gaps between electrodes 42a-42e and 46a-46d will also be illuminated by light conducting means 30.

Light scattering surfaces 80 and 82 may be formed on surfaces 35 and 37 similarly to the previously described means for forming light scattering surfaces 4 and 4' on light conducting means 2.

An electrical line 80 from a voltage source (not shown) is connected to electrode 22a on wafer 20 while a second line 86 to a load (also not shown) is connected to electrode 62e on wafer 60 to provide the input and output connections to switch 16.

As shown in FIG. 6, line 82 interconnects electrode 22e on wafer 20 with electrode 42e on wafer 40, while line 84 interconnects electrode 42a on wafer 40 with electrode 62a on wafer 60. While lines 82 and 84 have been depicted in FIG. 6 as discreet lines external to the stack, they could be formed internal to the stack by the provision of vias or opening formed in planar glass members 30 and 50 which openings would then be filled with conductive material.

By these electrical connections between the electrodes on the three wafers, through connecting lines 82 and 84, all of the photoconductive gaps formed between the electrodes on wafers 20, 40, and 60 are placed in series. This, in turn, permits switch 16 to be used in high voltage applications, e.g., 10-100 kilovolts since the total hold-off voltage of switch 16 will be the sum of the eight separate hold-off voltages across the respective gaps.

Alternatively, as shown by dotted lines 83 and 85 in FIG. 6, input line 80 may be connected to electrodes 22a, 42a, and 62a through line 83 and 84, while output line 86 may be connected to electrodes 22e, 42e and 62e through lines 82 and 85. This places the series connected gaps in wafer 20 in parallel to the series-connected gaps in wafer 40 and the series-connected gaps in wafer 60 to instead increase the current-carrying capabilities of switch 16.

It should be noted, in this regard, that by providing external leads for electrodes 22e, 42a, 42e, and 62a, as well as electrodes 22a and 62e, the user may choose whether to connect the wafer stack in parallel or series.

Referring, in particular to wafer 20 and electrodes 22a-22e and 26a-26d formed respectively on opposite surfaces 24 and 28 of wafer 20, a voltage applied to electrode 22a is transmitted across the thickness of wafer 20 to electrode 26a, back across the wafer thickness to electrode 22b, and then back and forth until it reaches electrode 22e, having thereby crossed the wafer thickness eight times. Thus, whatever the hold-off voltage is between electrodes 22a and 26a, representing the thickness and dielectric strength of wafer 20, this voltage may effectively be multiplied by eight in view of the series connection of the eight gaps created respectively between electrodes 22a-22e and 26a-26d.

Figure 8:
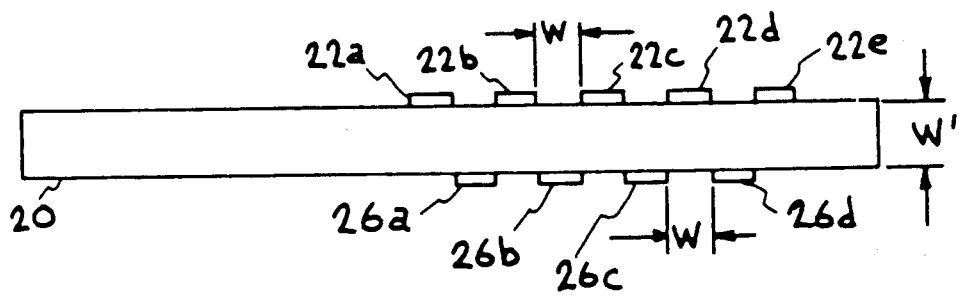
FIG. 8 is an enlarged vertical cross-sectional view of the wafer shown in FIG. 7.

It will be noted that the positioning of electrodes 22a-22e on surface 24 of wafer 20 are staggered with respect to the spacing of electrodes 26a-26d on opposite surface 28 of wafer 20. It will also be noted that the distance or gap W' between the staggered electrodes on the opposite surfaces of the wafer, i.e., the thickness of wafer 20, is always less than the spacing W between adjacent electrodes on the same surface, as shown in FIG. 8, to insure that the current travels through the thickness of the wafer to the next electrode, not along the surface.

Thus, for example, when wafer 20 is 10 microns thick, electrode 22a must be laterally spaced from electrode 22b a distance greater than 10 microns to assure that the current path from electrode 22a is across the thickness of wafer 20 to electrode 26a, not across surface 24 to electrode 22b.

The width of the stack of wafers 20, 40 and 60 and planar glass members 30 and 50, i.e., the dimension in which the length of the electrodes on the surfaces of the wafers extend, will vary with the desired current carrying capacity of the switch with a greater width permitting the formation of longer electrodes with higher current-carrying capabilities.

The length of the stack will depend on the number of electrodes to be formed and on the width of each electrode and the spacing between the electrodes. The number of electrodes used will affect the hold-off voltage of the device while the width of each electrode will affect the current-carrying capacity of the switch.

The operation of optically activated switch 16 is as follows. To turn switch 16 on, light sources 100, 110, and 112 are simultaneously illuminated to render photoconductive wafers 20, 40, and 60 conductive. Light is transmitted to the external surfaces of wafers 20 and 60 not covered respectively by electrodes 22a-22e and 66a-66d from light sources 110 and 112; while light from light source 100 is transmitted through planar glass members 30 and 50 to light scattering regions 80 and 82 from which the light is transmitted to the internal areas not covered by electrodes on surface 28 of wafer 20, surfaces 44 and 48 on wafer 40, and surface 64 on wafer 60. In this manner all of the gaps in wafers 20, 40, and 60 between the respective electrodes are uniformly illuminated causing electrical conduction across these gaps at least until light sources 100, 110, and 112 are extinguished.

Thus, the invention provides a novel transparent light transmitting means with light scattering means selectively placed thereon, as well as an improved optically activated electrical switch constructed using same wherein a stack of photoconductive wafers, each having electrodes on opposite surfaces thereof, may be formed and light may be uniformly transmitted to the interior surface areas of the photoconductive wafers in the stack via the novel transparent light transmitting means of the invention. In this manner, a compact optically activated electrical switch may be formed with enhanced current-carrying and voltage hold-off capabilities.

While a specific embodiment of the novel transparent light transmitting means with light scattering means selectively placed thereon and optically activated electrical switch constructed therefrom, as well as the methods for making same have been illustrated and described in accordance with this invention, modifications and changes of the apparatus, parameters, materials, etc. will become apparent to those skilled in the art, and it is intended to cover in the appended claims all such modifications and changes which come within the scope of the invention.

What is claimed is:

1. A transparent selective illumination means suitable for use in an optically activated electrical switch comprising at least two stacked photoconductive wafers, said illumination means comprising planar transparent light conducting means and light scattering means on selected portions of one or more planar surfaces thereof.

2. A planar transparent selective illumination means suitable for use in an optically activated electrical switch between two stacked photoconductive wafers respectively adjacent opposite planar surfaces thereof, said illumination means comprising planar transparent light conducting means, and light scattering means on selected portions of each of said opposite planar surfaces thereof capable of transmitting light to said photoconductive wafers adjacent said opposite planar surfaces.

3. The illumination means of claim 2 wherein said planar transparent light conducting means has an index of refraction higher than air.

4. The illumination means of claim 2 wherein said planar transparent light conducting means further comprises a first end surface coupled to a source of light.

5. The illumination means of claim 4 wherein said planar transparent light conducting means further comprises side surfaces polished to reflect divergent light from said first end surface back to the interior of said light conducting means.

6. The illumination means of claim 5 wherein said planar transparent light conducting means further comprises a second end surface located at the opposite end of said light conducting means from said first end surface and provided with a mirrored surface to reflect light back across said light conducting means.

7. The illumination means of claim 6 wherein said light scattering means on said planar surfaces of said planar transparent light conducting means comprise strips of non-polished surface.

8. The illumination means of claim 6 wherein said light scattering means on said planar surface of said planar transparent light conducting means comprise strips of non-polished surface formed by chemically etching selective portions of said one or more planar surfaces.

9. The illumination means of claim 6 wherein said light scattering means on said one or more planar surfaces of said planar transparent light conducting means comprise strips of non-polished surface formed by physically roughening selective portions of said one or more planar surfaces.

10. The illumination means of claim 6 wherein said light scattering means on said one or more planar surfaces of said planar transparent light conducting means comprise strips of non-polished surface formed by molding roughened surfaces into selective portions of said one or more planar surfaces.

11. The illumination means of claim 2 wherein said said planar transparent light conducting means comprises a transparent crystalline material.

12. The illumination means of claim 2 wherein said planar transparent light conducting means comprises transparent fused quartz.

13. The illumination means of claim 2 wherein said said planar transparent light conducting means comprises a sheet of transparent glass.

14. The illumination means of claim 2 wherein said said planar transparent light conducting means comprises a sheet of transparent plastic.

15. An optically activated electrical switch comprising at least two stacked photoconductive wafers, each having electrodes formed on both surfaces thereof, and separated by planar transparent light conducting means capable of conducting light to surfaces of said wafers facing said light conducting means.

16. The optically activated electrical switch of claim 14 wherein said planar transparent light conducting means further comprises light scattering means on one or more planar surfaces of said light conducting means opposite surfaces of said wafers not covered by said electrodes to transmit light from said light conducting means into the photoconductive material comprising said wafers.

17. The optically activated light switch of claim 15 wherein said planar transparent light conducting means further comprise reflective means on other portions of said surfaces of said light conducting means not containing said light scattering means.

18. An optically activated electrical switch comprising:
   (a) at least two stacked photoconductive wafers, each having one or more electrodes formed on both surfaces thereof; and
   (b) planar transparent light conducting means in between said photoconductive wafers capable of conducting light to surfaces of said wafers facing planar surfaces of said light conducting means comprising:
      (i) light scattering means on portions of one or more surfaces of said planar light conducting means opposite surfaces of said wafers not covered by said electrodes to transmit light from said light conducting means into said photoconductive wafers: and
      (ii) reflective means on other surfaces of said planar glass member not containing said light scattering means.

19. The optically activated electrical switch of claim 18 wherein said photoconductive wafer comprises a material selected from the class consisting of doped silicon, indium phosphide, and gallium arsenide.

20. The optically activated electrical switch of claim 18 wherein each of said one or more electrodes formed on the surfaces of said wafers comprise a single metallic electrode formed on a surface of said wafer with openings therein to permit passage of light into said wafer.

21. An optically activated electrical switch comprising:
   (a) at least two stacked photoconductive wafers, each having one or more electrodes formed on both surfaces thereof comprising spaced apart parallel metallic strips on one surface of each wafer staggered from spaced apart parallel metallic strips on the opposite surface of each wafer; and
   (b) planar transparent light conducting means in between said photoconductive wafers capable of conducting light to surfaces of said wafers facing planar surfaces of said light conducting means comprising:
      (i) light scattering means on portions of one or more surfaces of said planar light conducting means opposite surfaces of said wafers not covered by said electrodes to transmit light from said light conducting means into said photoconductive wafers; and
      (ii) reflective means on other surfaces of said planar glass member not containing said light scattering means.

22. The optically activated electrical switch of claim 18 which further includes illumination means to illuminate at least a portion of the interior surfaces of said photoconductive wafers through said light conducting means.

23. The optically activated electrical switch of claim 18 which further includes illumination means to illuminate the exterior surfaces of said switch and illumination means to illuminate at least a portion of the interior surfaces of said photoconductive wafers through said light conducting means.

24. The optically activated electrical switch means of claim 23 wherein said planar transparent light conducting means comprises a transparent crystalline material.

25. The optically activated electrical switch means of claim 23 wherein said said planar transparent light conducting means comprises transparent fused quartz.

26. The optically activated electrical switch means of claim 23 wherein said planar transparent light conducting means comprises transparent glass.

27. The optically activated electrical switch means of claim 23 wherein said said planar transparent light conducting means comprises transparent plastic.

28. The optically activated electrical switch of claim 18 wherein said light scattering means further comprise non-smooth portions on said one or more surfaces of said light conducting means facing surfaces of said wafers.

29. The optically activated electrical switch of claim 18 wherein said light scattering means further comprise etched portions on said one or more surfaces of said light conducting means facing surfaces of said wafers.

30. The optically activated electrical switch of claim 18 wherein said light scattering means further comprise mechanically roughened portions on said one or more surfaces of said light conducting means facing surfaces of said wafers.

31. The optically activated electrical switch of claim 18 wherein said light scattering means further comprise roughened portions molded into one or more of said surfaces of said light conducting means facing surfaces of said wafers.

32. An optically activated electrical switch comprising:
   (a) a first photoconductive wafer having:
      (i) one or more metallic electrodes formed on a first surface thereof; and
      (ii) one or more metallic electrodes formed on the opposite surface of said wafer;
   (b) a second photoconductive wafer having:
      (i) one or more metallic electrodes formed on a first surface thereof; and
      (ii) one or more metallic electrodes formed on the opposite surface of said wafer; and
   (c) first planar transparent light conducting means in between said first and second photoconductive wafers capable of conducting light to surfaces of said wafers facing said light conducting means and having light scattering means comprising one or more etched surfaces on portions of planar surfaces of said light conducting means opposite surfaces of said wafers not covered by said electrodes to transmit light from said light conducting means into said photoconductive material comprising said wafers.

33. The optically activated electrical switch of claim 32 wherein said planar transparent light conducting means further comprises reflective means on at least a portion of said surfaces of said light conducting means not containing said light scattering means.

34. The optically activated electrical switch of claim 32 which further includes illumination means to illuminate at least a portion of the interior surfaces of said photoconductive wafers through said light conducting means.

35. The optically activated electrical switch of claim 32 which further includes a third photoconductive wafer with one or more metallic electrodes formed on first and second surfaces thereon as on said first and second photoconductive wafers, and second planar transparent light conducting means in between said second and third photoconductive wafers and formed similarly to said first light conducting means to transmit light into the photoconductive material comprising said second and third wafers.

36. The optically activated electrical switch of claim 32 which further includes one or more additional photoconductive wafers with one or more metallic electrodes formed on first and second surfaces thereon as on said first and second photoconductive wafers to form a stack of said photoconductive wafers, and planar transparent light conducting means in between adjacent photoconductive wafers in said stack and formed similarly to said first light conducting means to transmit light into each of said photoconductive wafers.

37. The optically activated electrical switch of claim 18 wherein said one or more electrodes formed on the surfaces of said wafers comprise spaced apart parallel metallic strips formed on the surfaces of each of said wafers.

* * * * *